(12) United States Patent
Niu et al.

(10) Patent No.: US 10,177,080 B2
(45) Date of Patent: Jan. 8, 2019

(54) MOLDED INTELLIGENT POWER MODULE

(71) Applicant: Alpha and Omega Semiconductor (Cayman) Ltd., Sunnyvale, CA (US)

(72) Inventors: Zhiqiang Niu, Santa Clara, CA (US); Bum-Seok Suh, Seongnam (KR); Jun Lu, San Jose, CA (US); Wonjin Cho, Suwon-si (KR)

(73) Assignee: ALPHA AND OMEGA SEMICONDUCTOR (CAYMAN) LTD., Sunnyvale, CA (US)

( * ) Notice: Subject to any disclaimer, the term of this patent is extended or adjusted under 35 U.S.C. 154(b) by 0 days.

(21) Appl. No.: 15/602,002

(22) Filed: May 22, 2017

(65) Prior Publication Data

US 2018/0108598 A1    Apr. 19, 2018

Related U.S. Application Data

(63) Continuation-in-part of application No. 15/294,766, filed on Oct. 16, 2016, now Pat. No. 9,704,789.

(51) Int. Cl.
| | |
|---|---|
| *H01L 23/495* | (2006.01) |
| *H05K 1/14* | (2006.01) |
| *H05K 3/32* | (2006.01) |
| *H05K 3/30* | (2006.01) |
| *H05K 3/34* | (2006.01) |
| *H01L 23/50* | (2006.01) |
| *H01L 23/528* | (2006.01) |

(Continued)

(52) U.S. Cl.
CPC ........ *H01L 23/49503* (2013.01); *H01L 23/50* (2013.01); *H01L 23/5286* (2013.01); *H01L 25/07* (2013.01); *H01L 25/16* (2013.01); *H01L 25/18* (2013.01); *H05K 1/145* (2013.01); *H05K 3/308* (2013.01); *H05K 3/32* (2013.01); *H05K 3/3421* (2013.01); *H01L 2224/01* (2013.01); *H01L 2924/13091* (2013.01)

(58) Field of Classification Search
CPC ....... H01L 2924/00; H01L 2924/00014; H01L 2224/48227; H01L 2224/73265; H01L 2924/00012; H01L 2224/32225; H01L 2224/48247; H01L 2924/181; H01L 2224/48465; H01L 2924/0002; H01L 2224/45099

See application file for complete search history.

(56) References Cited

U.S. PATENT DOCUMENTS 7,952,317 B2 *   5/2011   Suh ................... H02P 27/08
                                                    318/801

* cited by examiner

*Primary Examiner* — Robert Bachner
(74) *Attorney, Agent, or Firm* — Chen-Chi Lin

(57) ABSTRACT

An intelligent power module (IPM) has a first, second, third and fourth die paddles, a first, second, third, fourth, fifth and sixth metal-oxide-semiconductor field-effect transistors (MOSFETs), a tie bar, an IC, a plurality of leads and a molding encapsulation. The first MOSFET is attached to the first die paddle. The second MOSFET is attached to the second die paddle. The third MOSFET is attached to the third die paddle. The fourth, fifth and sixth MOSFETs are attached to the fourth die paddle. The IC is attached to the tie bar. The molding encapsulation encloses the first, second, third and fourth die paddles, the first, second, third, fourth, fifth and sixth MOSFETs, the tie bar and the IC. The IPM is a small-outline package. It reduces system design time and improves reliability. The IC includes boost diodes. It reduces a package size of the IPM.

16 Claims, 5 Drawing Sheets

(51) Int. Cl.
*H01L 25/07* (2006.01)
*H01L 25/16* (2006.01)
*H01L 25/18* (2006.01)

MOLDED INTELLIGENT POWER MODULE

CROSS-REFERENCE TO RELATED APPLICATIONS

This patent Application is a Continuation in Part (CIP) application of a pending application Ser. No. 15/294,766 filed on Oct. 16, 2016 by having a common inventor. The Disclosure made in the patent application Ser. No. 15/294,766 is hereby incorporated by reference.

FIELD OF THE INVENTION

This invention relates generally to a molded intelligent power module (IPM) for driving a motor. More particularly, the present invention relates to a molded IPM having a compact size.

BACKGROUND OF THE INVENTION

A conventional IPM for driving a motor has three driving integrated circuits (ICs). In the patent application Ser. No. 15/294,766, an IPM has a low voltage IC and a high voltage IC. In the present disclosure, an IPM has a single IC directly attached to a tie bar. In the patent application Ser. No. 15/294,766, the IPM is a dual-in-line package. In the present disclosure, the IPM is a small-outline package.

The small-outline package reduces system design time and improves reliability. The single IC includes boost diodes. Therefore, it reduces the package size.

SUMMARY OF THE INVENTION

The present invention discloses an IPM having a first, second, third and fourth die paddles, a first, second, third, fourth, fifth and sixth metal-oxide-semiconductor field-effect transistors (MOSFETs), a tie bar, an IC, a plurality of leads and a molding encapsulation. The first MOSFET is attached to the first die paddle. The second MOSFET is attached to the second die paddle. The third MOSFET is attached to the third die paddle. The fourth, fifth and sixth MOSFETs are attached to the fourth die paddle. The IC is attached to the tie bar. The molding encapsulation encloses the first, second, third and fourth die paddles, the first, second, third, fourth, fifth and sixth MOSFETs, the tie bar and the IC.

A power lead is between a ground lead and an isolation lead. One end of the isolation lead terminates in the molding encapsulation. The isolation lead is between the power lead and an other lead. By having the isolation lead, the distance between the power lead and the other lead is increased. It increases the creepage distance for high voltage application.

DETAILED DESCRIPTION OF THE INVENTION

Figure 1:
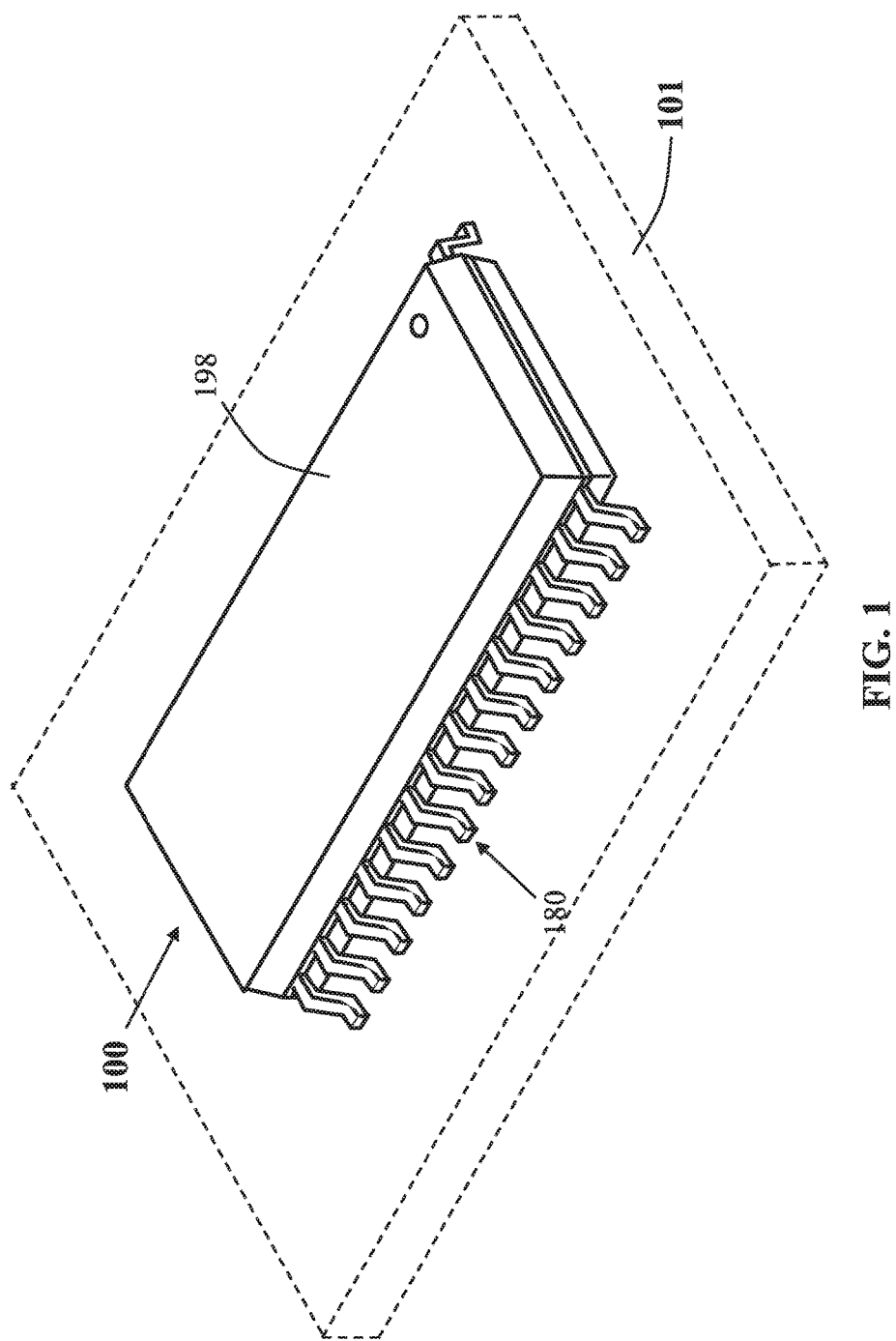
FIG. 1 is a perspective view of an intelligent power module (IPM) in examples of the present disclosure.

FIG. 1 is a perspective view of an IPM 100 in examples of the present disclosure. The IPM 100 has a plurality of leads 180. The plurality of leads 180 are partially embedded in a molding encapsulation 198.

Figure 2:
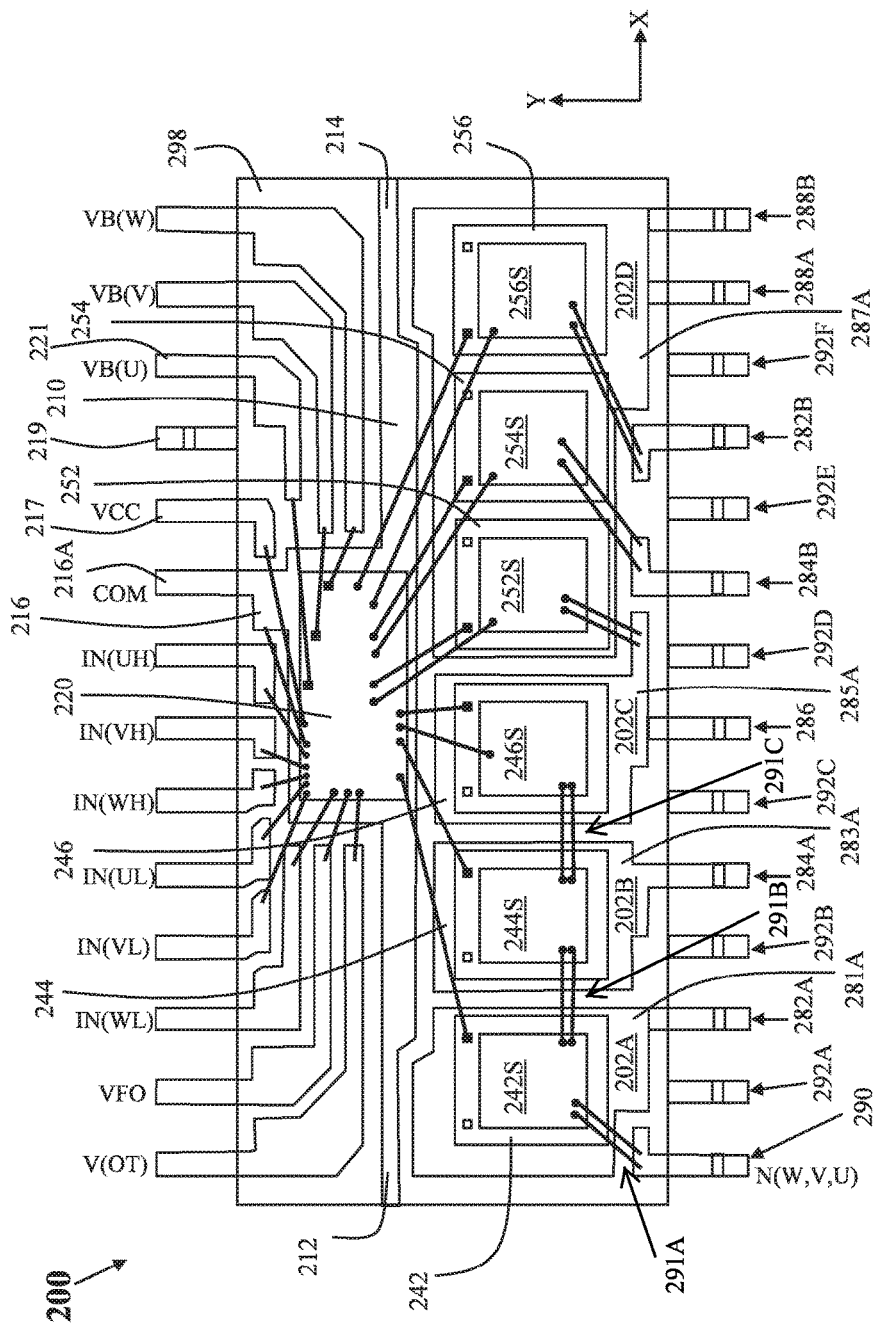
FIG. 2 is a top view of an IPM (with an outline of a molding encapsulation) in examples of the present disclosure.

FIG. 2 is a top view of an IPM 200 in examples of the present disclosure. The IPM 200 has a first die paddle 202A, a second die paddle 202B, a third die paddle 202C, a fourth die paddle 202D, a first transistor 242, a second transistor 244, a third transistor 246, a fourth transistor 252, a fifth transistor 254, a sixth transistor 256, a tie bar 210, an IC 220, a plurality of leads and a molding encapsulation 298.

The first die paddle 202A, the second die paddle 202B, the third die paddle 202C, and the fourth die paddle 202D are separated from each other and arranged one by one next to each other in a sequence. In examples of the present disclosure, a portion of an upper side edge of the first die paddle 202A, an upper side edge of the second die paddle 202B, an upper side edge of the third die paddle 202C, and a portion of an upper side edge of the fourth die paddle 202D are co-planar. In one example, a middle section of a lower side edge of the tie bar 210 is along X-direction and is parallel to the upper side edges of the second die paddle 202B and the third die paddle 202C. In another example, a middle section of a lower side edge of the tie bar 210 is parallel to a portion of an upper side edge of the first die paddle 202A. In still another example, a middle section of a lower side edge of the tie bar 210 is parallel to a portion of an upper side edge of the fourth die paddle 202D. The first transistor 242 is attached to the first die paddle 202A. The second transistor 244 is attached to the second die paddle 202B. The third transistor 246 is attached to the third die paddle 202C. The fourth transistor 252, the fifth transistor 254 and the sixth transistor 256 are attached to the fourth die paddle 202D.

In examples of the present disclosure, the tie bar 210 extends along the upper edges of the die paddles 202A, 202B, 202C and 202D. A first end 212 of the tie bar 210 extends beyond an outer edge of the first die paddle 202A. A second end 214 of the tie bar 210 extends beyond an outer edge of the fourth die paddle 202D. In examples of the present disclosure, the tie bar 210 further includes a mid-range extension 216 between the first end 212 and the second end 214. The mid-range extension 216 of the tie bar 210 is mechanically and electrically connected to a ground lead 216A. The mid-range extension 216 extends along a lateral direction (Y-direction) perpendicular to the upper edge of the third die paddle 202C. In examples of the present disclosure, a power lead 217 is between the ground lead 216A and an isolation lead 219. One end of the isolation lead 219 terminates in the molding encapsulation 298. The isolation lead 219 is between the power lead 217 and a lead 221. By having the isolation lead 219, the distance between the power lead 217 and the lead 221 is increased. It increases electrical current capability. The IC 220 is attached to an expansion area of the tie bar 210 between the first end 212 and the second end 214. In examples of the present disclosure, the IC 220 is electrically connected to the first transistor 242, the second transistor 244, the third transistor 246, the fourth transistor 252, the fifth transistor 254 and the sixth transistor 256 by bonding wires. In examples of the present disclosure, the bonding wires are preferably gold bonding wires.

In examples of the present disclosure, the molding encapsulation 298 encloses the first die paddle 202A, the second die paddle 202B, the third die paddle 202C, the fourth die paddle 202D, the first transistor 242, the second transistor 244, the third transistor 246, the fourth transistor 252, the fifth transistor 254, the sixth transistor 256, the tie bar 210, and the IC 220. In examples of the present disclosure, the plurality of leads are partially embedded in the molding encapsulation 298. In examples of the present disclosure, end surfaces of the first end 212 and the second end 214 of the tie bar 210 are exposed from edge surfaces of the molding encapsulation 298.

In examples of the present disclosure, the IPM 200 has leads 290, 292A, 282A, 292B, 284A, 292C, 286, 292D, 284B, 292E, 282B, 292F, 288A and 288B. In examples of the present disclosure, leads 282A, 284A, 286, 288A and 288B are high-voltage leads. A first connecting member 281A connects the first die paddle 202A to a first lead 282A. A second connecting member 283A connects the second die paddle 202B to a second lead 284A. A third connecting member 285A connects the third die paddle 202C to a third lead 286. A fourth connecting member 287A connects the fourth die paddle 202D to a fourth lead 288A.

In examples of the present disclosure, lead 290 is a low-voltage lead. Leads 282A, 282B, 284A, 284B, 286, 288A and 288B are high-voltage leads. In examples of the present disclosure, in an application, the high-voltage leads 282A and 282B may be shorted together. The high-voltage leads 284A and 284B may be shorted together.

In examples of the present disclosure, a first isolation lead 292A is between a first low-voltage lead 290 and the first lead 282A. A second isolation lead 292B is between the first lead 282A and a second lead 284A. A third isolation lead 292C is between the second lead 284A and a third lead 286. A fourth isolation lead 292E is between a first selected high-voltage lead 284B and a second selected high-voltage lead 282B. A fifth isolation lead 292F is between the second selected high-voltage lead 282B and a fourth lead 288A. The first lead 282A is connected to the second selected high-voltage lead 282B through a printed circuit board 101 of FIG. 1 (shown in dashed lines) and the second lead 284A is connected to the first selected high-voltage lead 284B through the printed circuit board 101 of FIG. 1. By connecting through the printed circuit board, it provides more space for the IC 220. Therefore, a size of the IC 220 may be increased.

In examples of the present disclosure, the IC 220 is directly attached to the tie bar 210. In examples of the present disclosure, the IPM 200 does not have another IC directly attached to the tie bar 210 (only the IC 220 is directly attached to the tie bar 210). The first, second, third, fourth, fifth and sixth transistors are metal-oxide-semiconductor field-effect transistors (MOSFETs). A first bonding wire 291A connects a source 242S of the first transistor 242 to the first low-voltage lead 290. A second bonding wire 291B connects the source 242S of the first transistor 242 to a source 244S of the second transistor 244. A third bonding wire 291C connects the source 244S of the second transistor 244 to a source 246S of the third transistor 246. In examples of the present disclosure, the first, second and third bonding wires are copper bonding wires.

Figure 3:
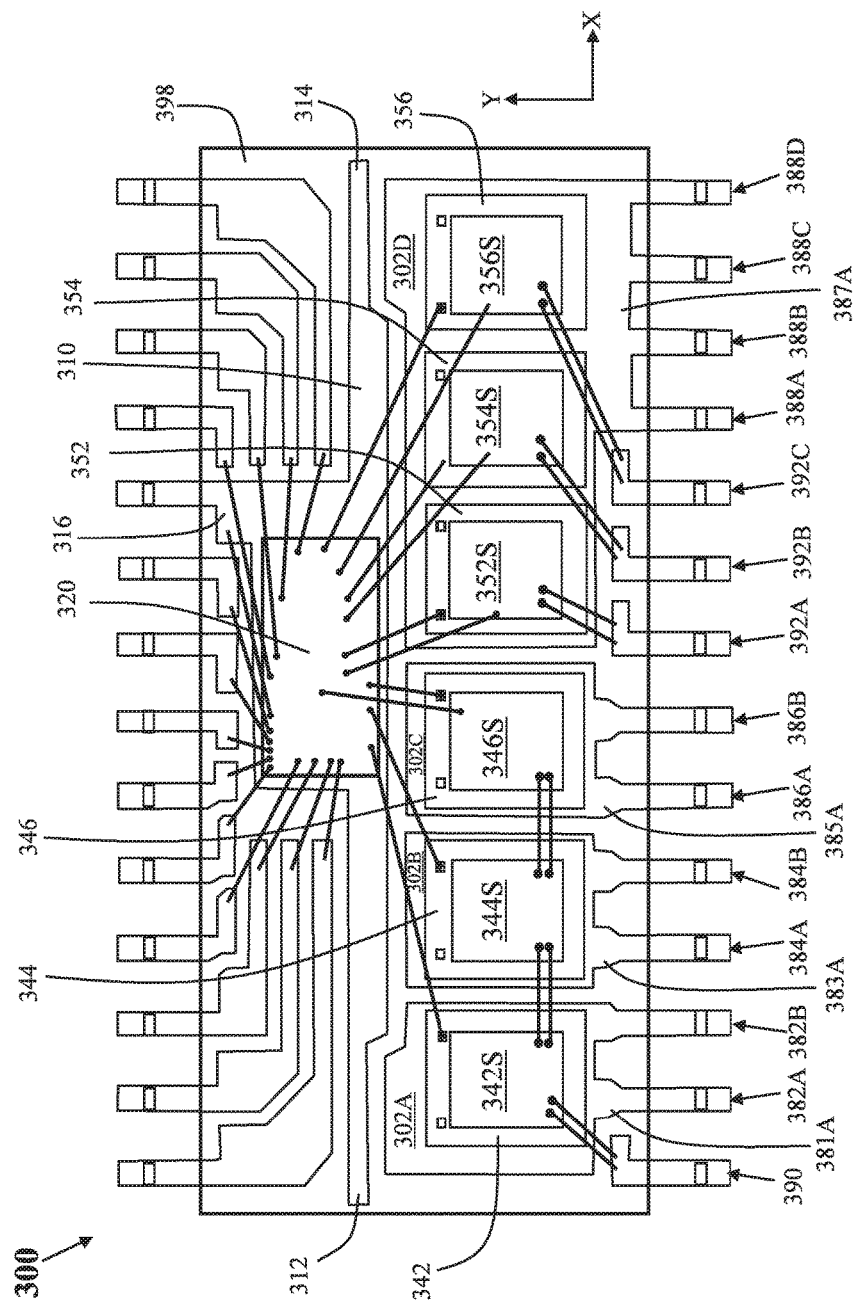
FIG. 3 is a top view of another IPM (with an outline of a molding encapsulation) in examples of the present disclosure.

FIG. 3 is a top view of an IPM 300 in examples of the present disclosure. The IPM 300 has a first die paddle 302A, a second die paddle 302B, a third die paddle 302C, a fourth die paddle 302D, a first transistor 342, a second transistor 344, a third transistor 346, a fourth transistor 352, a fifth transistor 354, a sixth transistor 356, a tie bar 310, an IC 320, a plurality of leads and a molding encapsulation 398.

The first die paddle 302A, the second die paddle 302B, the third die paddle 302C, and the fourth die paddle 302D are separated from each other and arranged one by one next to each other in a sequence. In examples of the present disclosure, a portion of an upper side edge of the first die paddle 302A, an upper side edge of the second die paddle 302B, an upper side edge of the third die paddle 302C, and a portion of an upper side edge of the fourth die paddle 302D are co-planar. In one example, a middle section of a lower side edge of the tie bar 310 is along X-direction and is parallel to the upper side edges of the second die paddle 302B and the third die paddle 302C. In another example, a middle section of a lower side edge of the tie bar 310 is parallel to a portion of an upper side edge of the first die paddle 302A. In still another example, a middle section of a lower side edge of the tie bar 310 is parallel to a portion of an upper side edge of the fourth die paddle 302D. The first transistor 342 is attached to the first die paddle 302A. The second transistor 344 is attached to the second die paddle 302B. The third transistor 346 is attached to the third die paddle 302C. The fourth transistor 352, the fifth transistor 354 and the sixth transistor 356 are attached to the fourth die paddle 302D.

In examples of the present disclosure, the tie bar 310 extends along the upper edges of the die paddles 302A, 302B, 302C and 302D. A first end 312 of the tie bar 310 extends beyond an outer edge of the first die paddle 302A. A second end 314 of the tie bar 310 extends beyond an outer edge of the fourth die paddle 302D. In examples of the present disclosure, the tie bar 310 further includes a mid-range extension 316 between the first end 312 and the second end 314. The mid-range extension 316 extends along a lateral direction (Y-direction) perpendicular to the upper edge of the third die paddle 302C. The IC 320 is attached to an expansion area of the tie bar 310 between the first end 312 and the second end 314. In examples of the present disclosure, the IC 320 is electrically connected to the first transistor 342, the second transistor 344, the third transistor 346, the fourth transistor 352, the fifth transistor 354 and the sixth transistor 356 by bonding wires. In examples of the present disclosure, the bonding wires are preferably gold bonding wires.

In examples of the present disclosure, the molding encapsulation 398 encloses the first die paddle 302A, the second die paddle 302B, the third die paddle 302C, the fourth die paddle 302D, the first transistor 342, the second transistor 344, the third transistor 346, the fourth transistor 352, the fifth transistor 354, the sixth transistor 356, the tie bar 310, and the IC 320. In examples of the present disclosure, the plurality of leads are partially embedded in the molding encapsulation 398.

In examples of the present disclosure, the IPM 300 has leads 390, 382A, 382B, 384A, 384B, 386A, 386B, 392A, 392B, 392C, 388A, 388B, 388C and 388D. A first connecting member 381A connects the first die paddle 302A to a first lead 382A. A second connecting member 383A connects the second die paddle 302B to a second lead 384A. A third connecting member 385A connects the third die paddle 302C to a third lead 386A. A fourth connecting member 387A connects the fourth die paddle 302D to a fourth lead 388A. A fifth lead 388B, a sixth lead 388C and a seventh lead 388D are directly connected to the fourth connecting member 387A.

Figure 4:
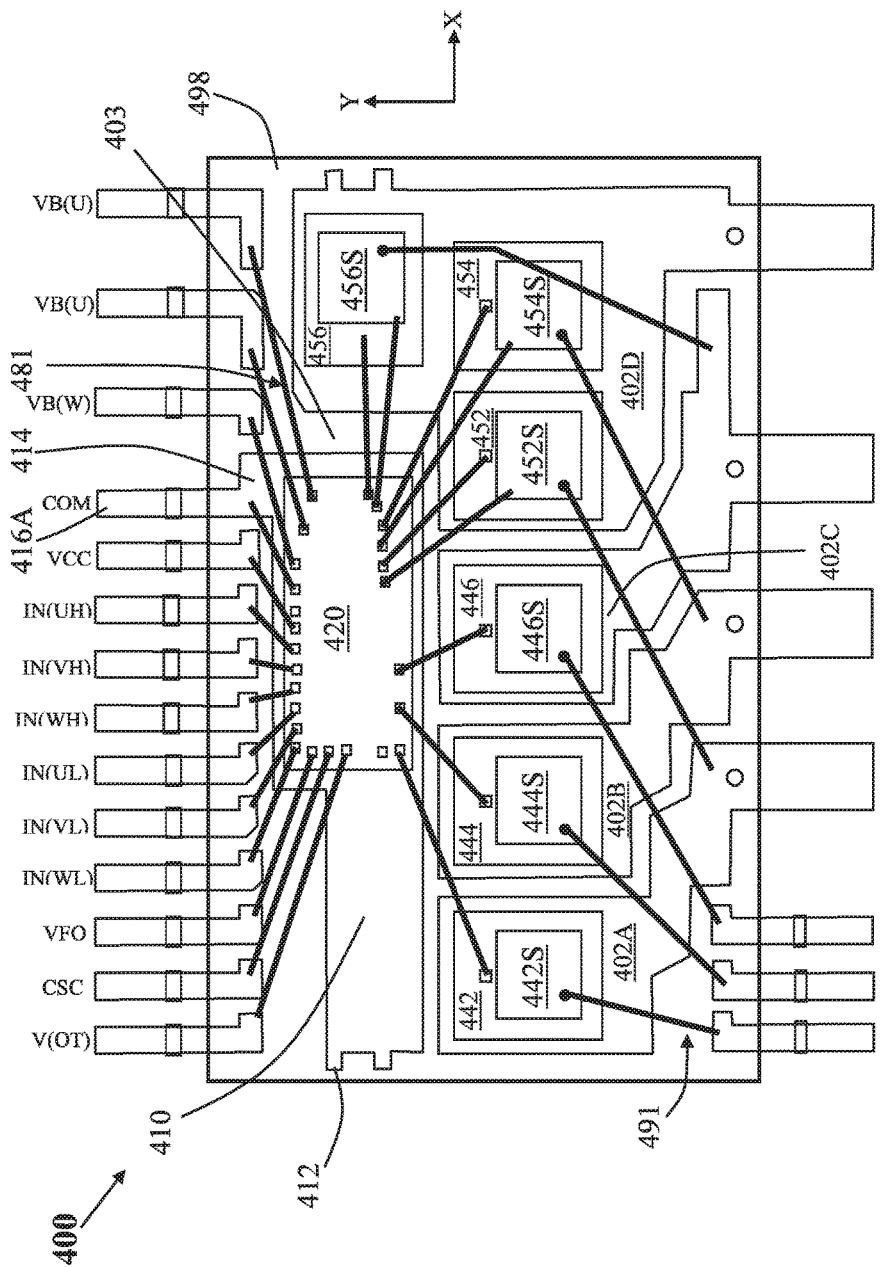
FIG. 4 is a top view of still another IPM (with an outline of a molding encapsulation) in examples of the present disclosure.

FIG. 4 is a top view of an IPM 400 in examples of the present disclosure. The IPM 400 has a first die paddle 402A, a second die paddle 402B, a third die paddle 402C, a fourth die paddle 402D, a fifth die paddle 410, a first transistor 442, a second transistor 444, a third transistor 446, a fourth transistor 452, a fifth transistor 454, a sixth transistor 456, an IC 420, a plurality of leads and a molding encapsulation 498. The first transistor 442 is attached to the first die paddle 402A. The second transistor 444 is attached to the second die paddle 402B. The third transistor 446 is attached to the third die paddle 402C. The fourth transistor 452, the fifth transistor 454 and the sixth transistor 456 are attached to the fourth die paddle 402D. The IC 420 is attached to the fifth die paddle 410.

In examples of the present disclosure, the fifth die paddle 410 has a first end 412 extending along X-direction beyond an outer edge of the first die paddle 402A to provide tie bar connection and a second end 414 extending along Y-direction. The first end 412 is narrower than other regions of the fifth die paddle 410. The second end 414 of the fifth die paddle 410 is mechanically and electrically connected to a ground lead 416A. The first die paddle 402A, the second die paddle 402B, the third die paddle 402C, the fourth die paddle 402D are disposed near at least two adjacent sides of the fifth die paddle 410. The IC 420 is mounted on a wider region of the fifth die paddle 410. The wider region is wider than other regions of the fifth die paddle 410. The wider region is adjacent to the second die paddle 402B, the third die paddle 402C and the fourth die paddle 402D.

In examples of the present disclosure, the fourth die paddle 402D is of an inverse letter "L" shape. The fourth die paddle 402D has a cutout 403 to accommodate a portion of the fifth die paddle 410 to facilitate the compactness of the IPM 400.

In examples of the present disclosure, a first plurality of bonding wires 481 connect the IC 420 to the plurality of leads or connect the IC 420 to the first transistor 442, the second transistor 444, the third transistor 446, the fourth transistor 452, the fifth transistor 454, the sixth transistor 456. In examples of the present disclosure, a second plurality of bonding wires 491 connect sources 442S, 444S, 446S, 452S, 454S and 456S to the plurality of leads. In examples of the present disclosure, the first plurality of bonding wires 481 are gold bonding wires for better wire drawing process. The second plurality of bonding wires 491 are copper bonding wires for cost reduction.

In examples of the present disclosure, the molding encapsulation 498 encloses the first die paddle 402A, the second die paddle 402B, the third die paddle 402C, the fourth die paddle 402D, the first transistor 442, the second transistor 444, the third transistor 446, the fourth transistor 452, the fifth transistor 454, the sixth transistor 456, the fifth die paddle 410, and the IC 420. In examples of the present disclosure, the plurality of leads are partially embedded in the molding encapsulation 498.

Figure 5:
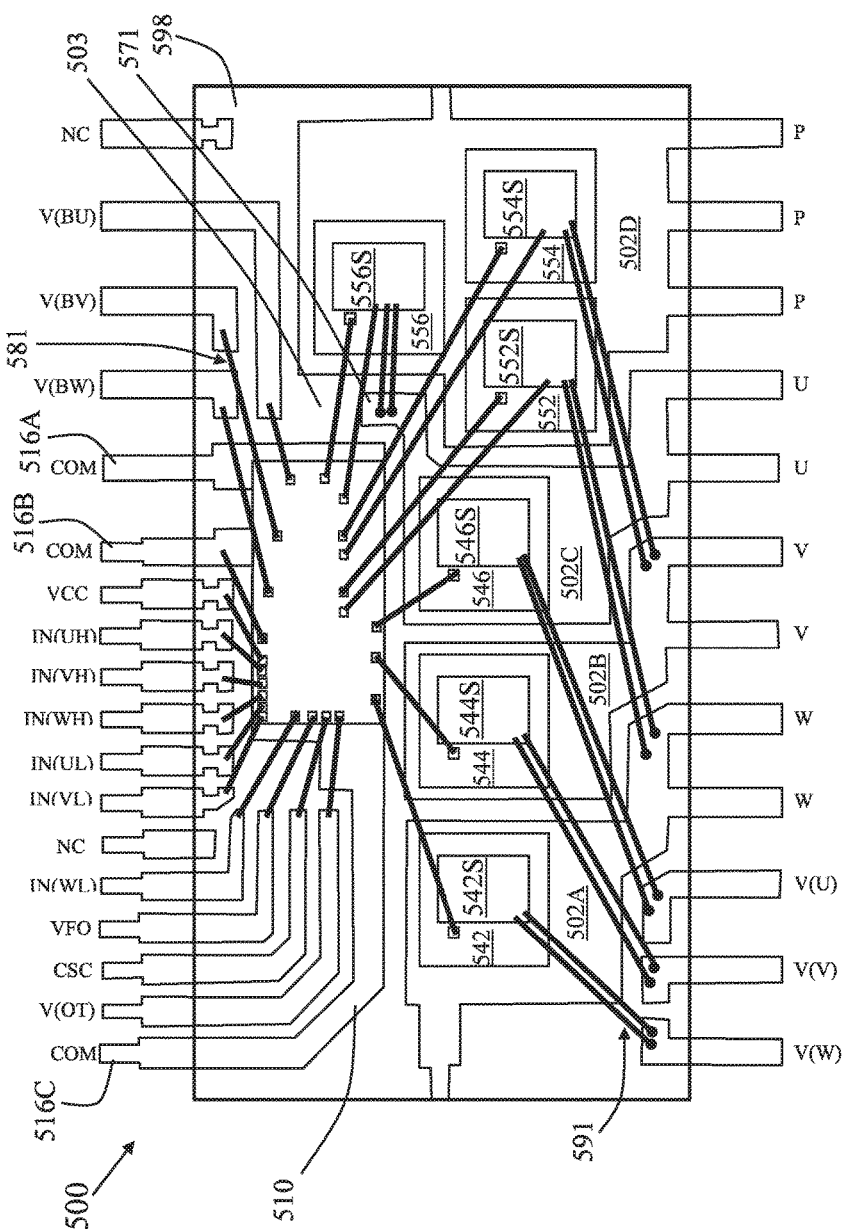
FIG. 5 is a top view of yet another IPM (with an outline of a molding encapsulation) in examples of the present disclosure.

FIG. 5 is a top view of an IPM 500 in examples of the present disclosure. The IPM 500 has a first die paddle 502A, a second die paddle 502B, a third die paddle 502C, a fourth die paddle 502D, a fifth die paddle 510, a first transistor 542, a second transistor 544, a third transistor 546, a fourth transistor 552, a fifth transistor 554, a sixth transistor 556, an IC 520, a plurality of leads and a molding encapsulation 598. The first transistor 542 is attached to the first die paddle 502A. The second transistor 544 is attached to the second die paddle 502B. The third transistor 546 is attached to the third die paddle 502C. The fourth transistor 552, the fifth transistor 554 and the sixth transistor 556 are attached to the fourth die paddle 502D. The IC 520 is attached to the fifth die paddle 510.

In examples of the present disclosure, the fifth die paddle 510 is mechanically and electrically connected to a first ground lead 516A, a second ground lead 516B and a third ground lead 516C.

In examples of the present disclosure, the first, second, third, fourth, fifth and sixth transistors 542, 544, 546, 552, 554 and 556 are metal-oxide-semiconductor field-effect transistors (MOSFETs). Sources 542S, 544S, 546S, 552S, 554S and 556S are on the first, second, third, fourth, fifth and sixth transistors 542, 544, 546, 552, 554 and 556 respectively. In examples of the present disclosure, a first plurality of bonding wires 581 connect the IC 520 to the plurality of leads or connect the IC 520 to the first transistor 542, the second transistor 544, the third transistor 546, the fourth transistor 552, the fifth transistor 554, the sixth transistor 556. In examples of the present disclosure, a second plurality of bonding wires 591 connect sources 542S, 544S, 546S, 552S, 554S and 556S to the plurality of leads. In examples of the present disclosure, the first plurality of bonding wires 581 are gold bonding wires for better wire drawing process. The second plurality of bonding wires 591 are copper bonding wires for cost reduction.

In examples of the present disclosure, the fourth die paddle 502D is of an inverse letter "L" shape. The fourth die paddle 502D has a cutout 503 to accommodate a wire bonding region 571 of the third die paddle 502C. A bonding wire connects a source 556S of the sixth transistor 556 to the wire bonding region 571 of the third die paddle 502C.

In examples of the present disclosure, the molding encapsulation 598 encloses the first die paddle 502A, the second die paddle 502B, the third die paddle 502C, the fourth die paddle 502D, the first transistor 542, the second transistor 544, the third transistor 546, the fourth transistor 552, the fifth transistor 554, the sixth transistor 556, the fifth die paddle 510, and the IC 520. In examples of the present disclosure, the plurality of leads are partially embedded in the molding encapsulation 598.

Those of ordinary skill in the art may recognize that modifications of the embodiments disclosed herein are possible. For example, a number of isolation leads and locations of isolation leads may vary. Other modifications may occur to those of ordinary skill in this art, and all such modifications are deemed to fall within the purview of the present invention, as defined by the claims.

The invention claimed is:

1. An intelligent power module (IPM) for driving a motor, the IPM comprising:
    a first, second, third and fourth die paddles;
    a first transistor attached to the first die paddle;
    a second transistor attached to the second die paddle;
    a third transistor attached to the third die paddle;
    a fourth, fifth, and sixth transistors attached to the fourth die paddle;
    an integrated circuit (IC) disposed adjacent to the second and third die paddles; the IC being electrically connected to the first, second, third, fourth, fifth, and sixth transistors;
    a plurality of leads; and
    a molding encapsulation enclosing the first, second, third, and fourth die paddles, the first, second, third, fourth, fifth, and sixth transistors, and the IC;
    wherein the plurality of leads are partially embedded in the molding encapsulation.

2. The IPM of claim 1 further comprising a tie bar having a first end, a second end and a mid-range extension and wherein the mid-range extension of the tie bar is mechanically and electrically connected to a ground lead.

3. The IPM of claim 2, wherein a first end surface of the first end and a second end surface of the second end of the tie bar are exposed from edge surfaces of the molding encapsulation.

4. The IPM of claim 2, wherein a power lead is between the ground lead and an isolation lead.

5. The IPM of claim 2, wherein at least a portion of an upper side edge of the first die paddle, upper side edges of the second and third die paddles, and at least a portion of an upper side edge of the fourth die paddle are co-planar;
wherein a middle section of a lower side edge of the tie bar is parallel to the upper side edges of the second and third die paddles.

6. The IPM of claim 1, wherein the IC is electrically connected to the first, second, third, fourth, fifth, and sixth transistors by a plurality of gold bonding wires and wherein a plurality of copper bonding wires electrically and mechanically connect the first, second, third, fourth, fifth and sixth transistors to a portion of the plurality of leads.

7. The IPM of claim 1, wherein a first connecting member connects the first die paddle to a first lead of the plurality of leads;
a second connecting member connects the second die paddle to a second lead of the plurality of leads;
a third connecting member connects the third die paddle to a third lead of the plurality of leads; and
a fourth connecting member connects the fourth die paddle to a fourth lead of the plurality of leads.

8. The IPM of claim 7, wherein a first isolation lead is between a first low-voltage lead and the first lead;
a second isolation lead is between the first lead and the second lead; and
a third isolation lead is between the second lead and the third lead.

9. The IPM of claim 8, wherein a fourth isolation lead is between a first selected high-voltage lead and a second selected high-voltage lead.

10. The IPM of claim 9, wherein the first lead is connected to the second selected high-voltage lead through a printed circuit board and wherein the second lead is connected to the first selected high-voltage lead through the printed circuit board.

11. The IPM of claim 7, wherein a fifth, sixth and seventh leads of the plurality of leads are directly connected to the fourth connecting member.

12. The IPM of claim 1, wherein the first transistor is a first metal-oxide-semiconductor field-effect transistor (MOSFET);
the second transistor is a second MOSFET;
the third transistor is a third MOSFET;
the fourth transistor is a fourth MOSFET;
the fifth transistor is a fifth MOSFET; and
the sixth transistor is a sixth MOSFET.

13. The IPM of claim 12, wherein a first bonding wire connects a source of the first MOSFET to a low-voltage lead;
a second bonding wire connects the source of the first MOSFET to a source of the second MOSFET; and
a third bonding wire connects the source of the second MOSFET to a source of the third MOSFET.

14. The IPM of claim 1, wherein a first plurality of bonding wires connect the IC to the plurality of leads or connect the IC to the first, second, third, fourth, fifth and sixth transistors; wherein a second plurality of bonding wires connect sources of the first, second, third, fourth, fifth and sixth transistors to a portion of the plurality of leads; wherein the first plurality of bonding wires are gold bonding wires; and wherein the second plurality of bonding wires are copper bonding wires.

15. The IPM of claim 1 further comprising a fifth die paddle, wherein the fourth die paddle is of an inverse letter L shape and wherein the fourth die paddle has a cutout to accommodate a portion of the fifth die paddle to facilitate a compactness of the IPM.

16. The IPM of claim 1, wherein the fourth die paddle is of an inverse letter L shape; wherein the fourth die paddle has a cutout to accommodate a wire bonding region of the third die paddle; and wherein a bonding wire connects a source of the sixth transistor to the wire bonding region of the third die paddle.

* * * * *